(12) United States Patent
Ice (10) Patent No.: US 7,859,849 B2
(45) Date of Patent: *Dec. 28, 2010

(54) MODULAR HEATSINK MOUNTING SYSTEM

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/466,244

(22) Filed: May 14, 2009

(65) Prior Publication Data

US 2009/0284930 A1 Nov. 19, 2009

Related U.S. Application Data

(60) Provisional application No. 61/127,748, filed on May 14, 2008, provisional application No. 61/127,749, filed on May 14, 2008.

(51) Int. Cl.
*H05K 7/20* (2006.01)

(52) U.S. Cl. .................... 361/715; 361/704; 361/719; 361/730

(58) Field of Classification Search .................. None
See application file for complete search history.

(56) References Cited

U.S. PATENT DOCUMENTS

| | | | |
|---|---|---|---|
| 5,342,216 A | | 8/1994 | Davis et al. |
| 5,859,766 A | | 1/1999 | Van Scyoc et al. |
| 5,920,459 A | | 7/1999 | Weber et al. |
| 6,788,540 B2 * | | 9/2004 | Kruger et al. ............... 361/719 |
| 6,811,413 B2 * | | 11/2004 | Keeble et al. ................. 439/79 |
| 6,816,376 B2 * | | 11/2004 | Bright et al. ................ 361/704 |
| 6,821,140 B2 | | 11/2004 | Wu |
| 6,870,746 B2 * | | 3/2005 | Leeson et al. ............... 361/816 |
| 6,875,056 B1 * | | 4/2005 | Bianchini et al. ......... 439/607.2 |
| 6,890,206 B2 | | 5/2005 | Distad et al. |
| 6,893,293 B2 * | | 5/2005 | Ice et al. ................... 439/607.2 |
| 6,986,679 B1 * | | 1/2006 | Aronson et al. ............. 439/374 |
| 7,033,202 B2 | | 4/2006 | Wu |
| 7,046,516 B2 * | | 5/2006 | Lee et al. .................... 361/704 |
| 7,048,452 B2 * | | 5/2006 | Malagrino, Jr. .............. 385/92 |
| 7,145,773 B2 | | 12/2006 | Shearman et al. |
| 7,215,549 B2 * | | 5/2007 | Kim ........................... 361/704 |
| 7,239,515 B2 * | | 7/2007 | Bulman-Fleming et al. . 361/704 |
| 7,457,126 B2 * | | 11/2008 | Ahrens ....................... 361/716 |

(Continued)

FOREIGN PATENT DOCUMENTS

KR   10-2006-0074839   7/2006

OTHER PUBLICATIONS

International Search Report and Written Opinion for PCT/US/2009/053933 dated Feb. 26, 2010.

*Primary Examiner*—Boris L Chervinsky
(74) *Attorney, Agent, or Firm*—Workman Nydegger (57) ABSTRACT

In one example, a host system includes a PCB, a plurality of rails disposed on the PCB, and a connector disposed on the PCB. The PCB, rails and connector define a slot configured to receive an optoelectronic module. The host system further includes means for removably mounting a modular heatsink to the host system such that the host system directly contacts the optoelectronic module when the optoelectronic module is fully inserted into the slot. The means for removably mounting has a standardized arrangement such that any modular heatsink having a mounting arrangement that is complementary to the standardized arranged can be removably mounted to the host system.

14 Claims, 8 Drawing Sheets

U.S. PATENT DOCUMENTS

| | | |
|---|---|---|
| 7,470,139 B2 | 12/2008 | Miki et al. |
| 2005/0213871 A1 | 9/2005 | Schwiebert et al. |
| 2006/0044774 A1 | 3/2006 | Vasavda et al. |
| 2007/0207670 A1 | 9/2007 | Stewart et al. |
| 2008/0137306 A1* | 6/2008 | Kim .......................... 361/709 |

* cited by examiner

MODULAR HEATSINK MOUNTING SYSTEM

CROSS-REFERENCE TO RELATED APPLICATIONS

The present application claims the benefit of and priority to U.S. Provisional Application Ser. No. 61/127,748, entitled "MODULAR HEATSINK MOUNTING SYSTEM," filed May 14, 2008, and to U.S. Provisional Application Ser. No. 61/127,749, entitled "CFP MSA FRONT BEZEL SYSTEM," filed May 14, 2008. The foregoing applications are fully incorporated herein by reference in their entirety.

BACKGROUND

1. Technology Field

Embodiments relate generally to host systems employed in communication networks. More particularly, example embodiments relate to host systems having standardized slots configured to accommodate modules of varying power classes.

2. Related Technology

Electronic modules, such as electronic or optoelectronic transceiver or transponder modules, are increasingly used in electronic and optoelectronic communication. Some modules can be plugged into a variety of host networking equipment. Multi-Source Agreements ("MSAs"), such as the X2 MSA, the XENPAC MSA, the 10 Gb/s Small Form Factor Pluggable ("XFP") MSA, and the CFP MSA specify, among other things, package dimensions for modules and/or power dissipation characteristics. Conformity with an MSA allows a module to be plugged into host equipment designed in compliance with the MSA. Modules typically communicate with a printed circuit board of a host device by transmitting electrical signals to the printed circuit board and receiving electrical signals from the printed circuit board. These electrical signals can then be transmitted by the module outside the host device as optical and/or electrical signals.

One common difficulty associated with modules concerns the generation of heat during the operation of the modules. The heat, if not dissipated, can cause a module to malfunction or to become damaged.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF SOME EXAMPLE EMBODIMENTS

In general, example embodiments relate to host systems having standardized mounting arrangements to which modular heatsinks can be removably mounted.

In one example embodiment, a host system includes a printed circuit board ("PCB"), a plurality of rails disposed on the PCB, and a connector disposed on the PCB. The PCB, rails and connector define a slot configured to receive an optoelectronic module. The host system further includes means for removably mounting a modular heatsink to the host system such that the host system directly contacts the optoelectronic module when the optoelectronic module is fully inserted into the slot. The means for removably mounting has a standardized arrangement such that any modular heatsink having a mounting arrangement that is complementary to the standardized arranged can be removably mounted to the host system.

In another example embodiment, a host system includes a PCB, a plurality of rails disposed on the PCB, and a connector disposed on the PCB. The PCB, rails and connector define a slot configured to receive an optoelectronic module. The host system further includes one or more mounting points arranged on the host system in a standardized manner allowing for interchangeable use of any one of a plurality of different modular heatsinks, each of the modular heatsinks having a mounting arrangement that is complementary to the standardized arrangement of the one or more mounting points such that each of the modular heatsinks can be removably mounted to the host system. The host system further includes means for bringing a mounted modular heatsink and the optoelectronic module into contact with each other in a direction substantially normal to corresponding contact surfaces of the mounted modular heatsink and the optoelectronic module.

These and other features of the present invention will become more fully apparent from the following description and appended claims, or may be learned by the practice of the invention as set forth hereinafter.

BRIEF DESCRIPTION OF THE DRAWINGS

To further clarify the above and other features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Example embodiments relate to host systems having standardized slots configured to accommodate modules, such as electronic or optoelectronic transceiver or transponder modules, of varying power classes. Some embodiments include movable and modular heatsink systems that can be implemented in host systems to dissipate heat generated by optoelectronic modules installed in the host systems. The particular modular heatsink employed in a given slot of the host system can be selected based on the power class of the optoelectronic module inserted into the slot. Alternately or additionally, one or more slots can omit a modular heatsink altogether.

Some embodiments include a host system with a PCB, plurality of rails, and connector that collectively define a slot. The host system further includes means for removably mounting a modular heatsink to the host system. The means for removably mounting has a standardized arrangement in some embodiments, such that any modular heatsink having a complementary mounting arrangement can be removably mounted to the host system. As such, a user can attach any desired modular heatsink to the host system for a given slot or omit a modular heatsink from a given slot depending on the needs of a particular application.

In some embodiments, the host system additionally includes means for substantially preventing sliding contact between an optoelectronic device and a modular heatsink during insertion of the optoelectronic device into the slot when the modular heatsink is removably mounted to the host system. By substantially preventing sliding contact between the optoelectronic device and the modular heatsink, thermal interface materials such as thermal pads can be implemented to enhance thermal conductivity between the optoelectronic device and the modular heatsink without such thermal interface materials being damaged during insertion of the optoelectronic device into the slot.

Embodiments can be implemented in conjunction with various modules, including optoelectronic modules. Examples of optoelectronic modules include, but are not limited to transponders, transceivers, transmitters, and/or receivers. Optoelectronic modules can be used, for instance, in telecommunications networks, local area networks, metro area networks, storage area networks, wide area networks, and the like.

Optoelectronic modules according to some embodiments can be configured for optical signal transmission and reception at a variety of per-second data rates including, but not limited to, 1 Gigabit per second ("G"), 2 G, 2.5 G, 4 G, 8 G, 10 G, 40 G, 100 G, or higher. Furthermore, the optoelectronic modules can be configured for optical signal transmission and reception at various wavelengths including, but not limited to, 850 nm, 1314 nm, 1470 nm, 1490 nm, 1510 nm, 1530 nm, 1550 nm, 1570 nm, 1590 nm, or 1610 nm. Further, the optoelectronic modules can be configured to support various transmission standards including, but not limited to, Fast Ethernet, Gigabit Ethernet, 10 Gigabit Ethernet, 100 Gigabit Ethernet and 1×, 2×, 4×, and 10× Fibre Channel. In addition, optoelectronic modules according to some embodiments can be configured to have a variety of different form factors that are substantially compliant with one or more multi-source agreements ("MSAs") including, but not limited to, the CFP MSA, the XENPAK MSA, the X2 MSA, the SFP MSA, the XFP MSA, or the like.

Moreover, optoelectronic modules according to some embodiments can be configured with certain power dissipation characteristics. For instance, optoelectronic modules complying with the X2 MSA may be configured to dissipate up to 4 Watts of power, between 4-5 Watts of power, or greater than 5 Watts of power. Other optoelectronic modules may be configured with other power dissipation characteristics. Further, in some embodiments, power is dissipated from optoelectronic modules in the form of heat.

Reference will now be made to the drawings wherein like structures will be provided with like reference designations. It should be understood that the drawings are diagrammatic and schematic representations of exemplary embodiments and, accordingly, are not limiting of the scope of the present invention, nor are the drawings necessarily drawn to scale.

I. Example Operating Environment

Figure 1A:
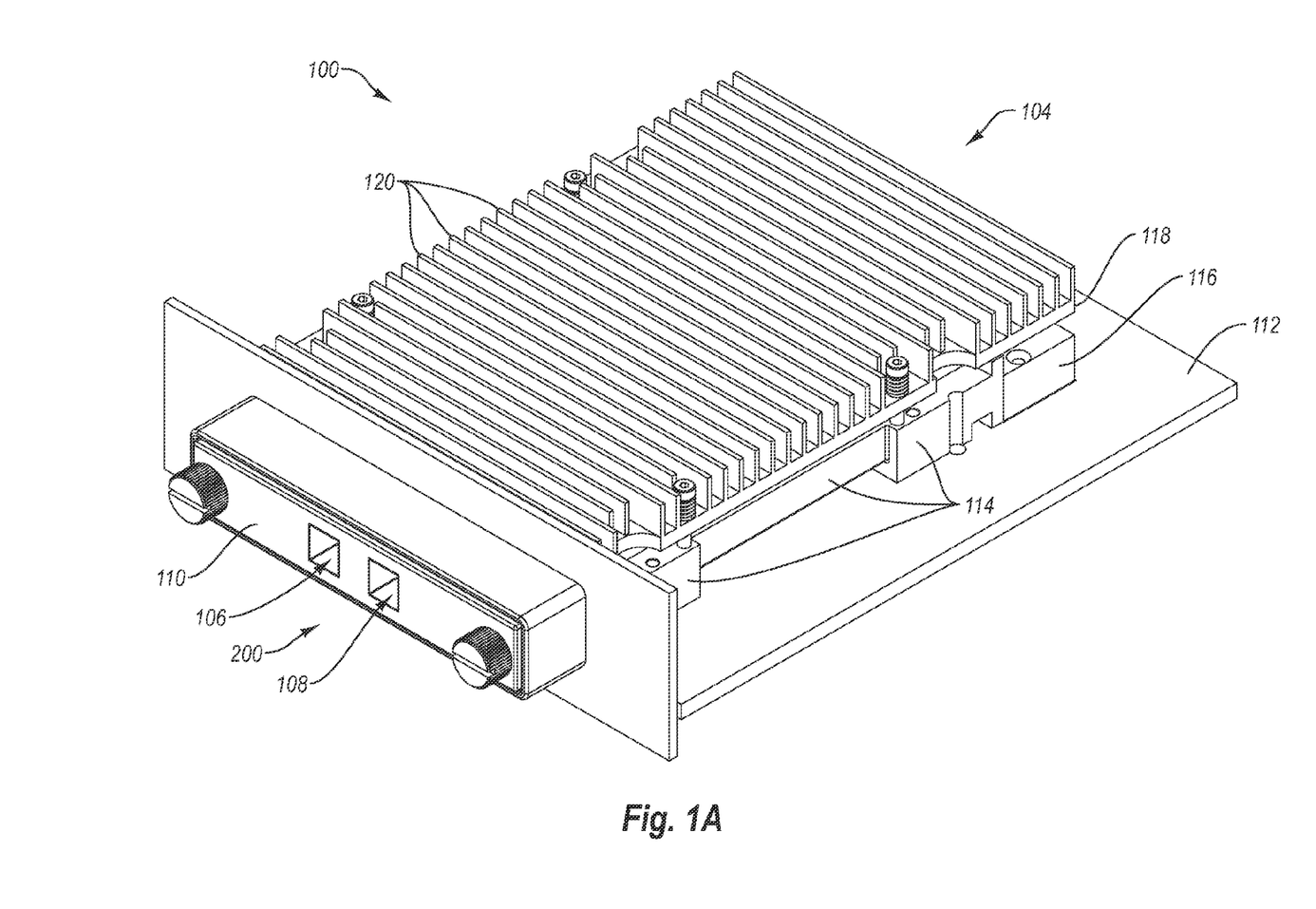
FIGS. 1A and 1B depict one environment wherein a host system according to embodiments of the invention may be implemented.
Figure 1B:
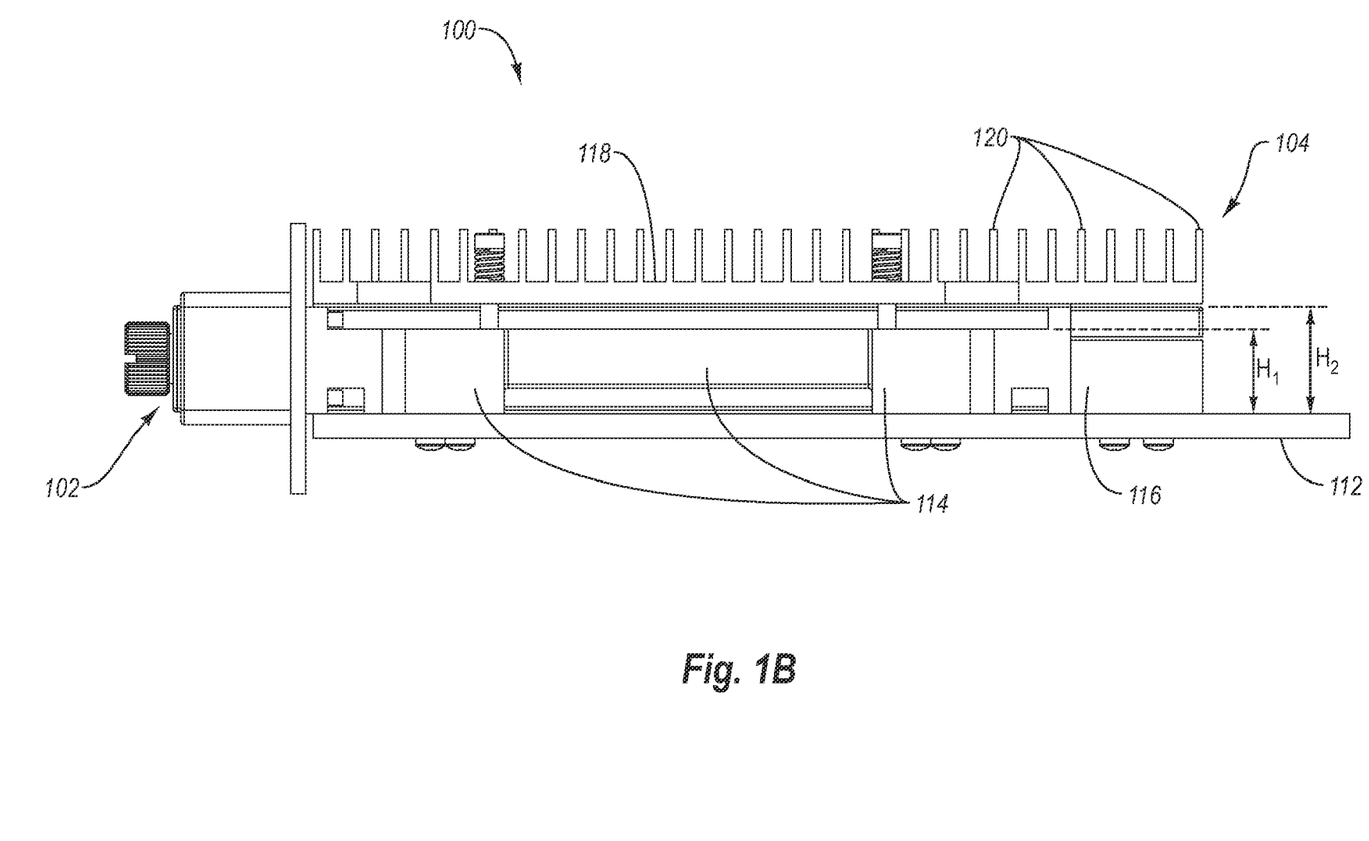

Reference will first be made to FIGS. 1A and 1B, which disclose an example operating environment 100 in which some embodiments can be practiced. While the example operating environment 100 will be described in some detail, it will be appreciated by one of ordinary skill in the art, with the benefit of the present disclosure, that the operating environment 100 is described by way of example only, and should not be construed to limit the invention.

The operating environment 100 includes a module 102 (such as an optoelectronic transceiver or transponder module) and a host system 104. The module 102 is positioned in a slot of the host system 104, described in greater detail below. As disclosed in FIG. 1A, the module 102 includes a transmit port 106 and a receive port 108 defined in a front portion 110 of the module 102. The transmit port 106 is configured to receive a connector coupled to a transmission medium such as optical fiber. Similarly, the receive port 108 is configured to receive a connector coupled to a transmission medium such as optical fiber.

The host system 104 includes a PCB 112, a plurality of rails 114 (only one of which is disclosed in FIGS. 1A and 1B), and a connector 116. The PCB 112, rails 114, and connector 116 collectively define a slot configured to receive the module 100. The rails 114 are configured to slidably engage the module 100 as it is inserted into the slot defined by the PCB 112, rails 114, and connector 116. The connector 116 is configured to electrically connect a PCB (not shown) and/or a PCB connector (not shown) of the module 102 to the PCB 112 to enable electrical communication between the module 102 and host system 104.

During operation, the module 102 receives one or more data-carrying electrical signals from the host system 104 via PCB 112 and connector 116. Although not shown, the module 102 can include circuitry and/or one or more active optical devices for converting the data-carrying electrical signal to a data-carrying optical signal for emission onto an optical fiber received in transmit port 106. Examples of such circuitry and an active optical device include a laser driver and a laser, respectively.

The module 102 can also receive one or more data-carrying optical signals from an optical fiber received in receive port 108. Although not shown, the module 102 can include one or more active optical devices and/or circuitry for converting the data-carrying optical signal to a data-carrying electrical signal which is provided to the host system 104 via connector 116 and PCB 112. Examples of such an active optical device and circuitry include a photodiode and a post amplifier, respectively.

Optionally, the host system 104 further includes a riding heatsink 118 having a plurality of fins 120. In some embodiments, the riding heatsink 118 is integrated with the host system 104.

In other embodiments, the riding heatsink 118 is a modular heatsink that is removably mounted to the rails 114 and/or other components of the host system 104. According to this example, a user can remove the riding heatsink 118 from the host system 104 when, for example, the module 102 has low power dissipation characteristics. Alternately or additionally, a user can removably mount a riding heatsink 118 to the host system 104, the modular heatsink 118 being selected by the user based on the power dissipation characteristics of the module 102. For instance a user might select a riding heatsink 118 having relatively short fins 120 and/or that is relatively less effective at dissipating heat for a module 104 having mid-range power dissipation characteristics, or a user might select a riding heatsink 118 having relatively tall fins 120 and/or that is relatively more effective at dissipating heat for a module 104 having high power dissipation characteristics.

During operation, components such as circuitry and/or active optical devices within the module 102 dissipate power, resulting in the generation of heat by the module 102 and its components. In the example of FIGS. 1A-1B, at least a portion of a top surface (not shown) of the module 102 is in direct physical contact with at least a portion of a bottom surface (not shown) of the riding heatsink 118. Accordingly, at least some of the heat generated by the module 102 is conductively transferred from the module 102 to the riding heatsink 118, where the heat can be dissipated into air flowing over the riding heatsink 118.

Alternately, in embodiments where the riding heatsink 118 is omitted, heat generated by the module 102 can be dissipated into air flowing over the top surface (not shown) of the module 102.

As best seen in FIG. 1B, in some embodiments, a height $H_1$ of rails 114 along a substantial length of the rails 114 is less than a height $H_2$ of the module 102 to enable air to flow substantially unobstructed across the top of the module 102 and thereby dissipate heat generated by the module 102. As such, some embodiments of the module 102 can include an integrated heatsink (FIG. 2B) such that the riding heatsink 118 can be omitted from the host system 104, the integrated heatsink dissipating heat generated by the module 102.

II. Modules

Figure 2A:
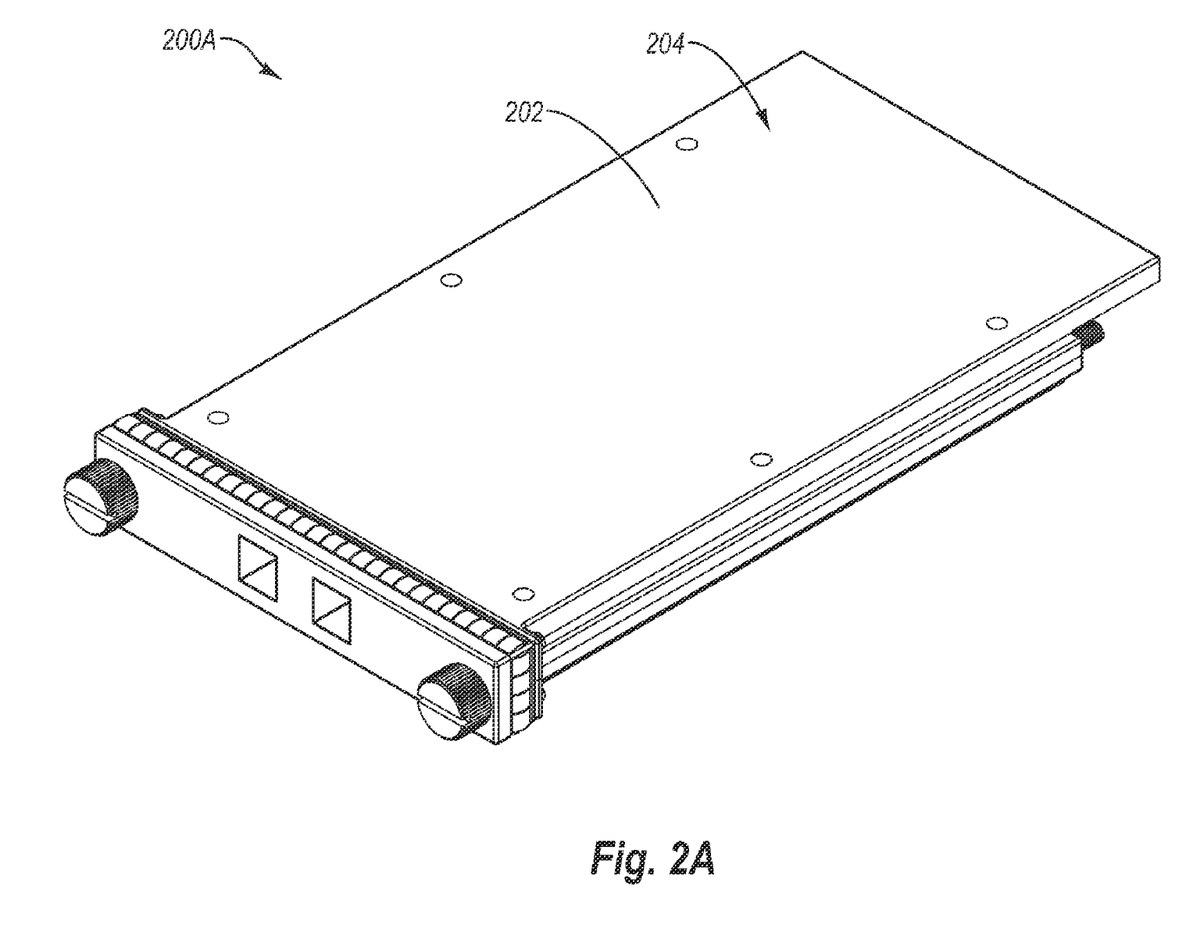
FIGS. 2A and 2B depict two embodiments of optoelectronic modules that can be inserted into the host system of FIGS. 1A and 1B.
Figure 2B:
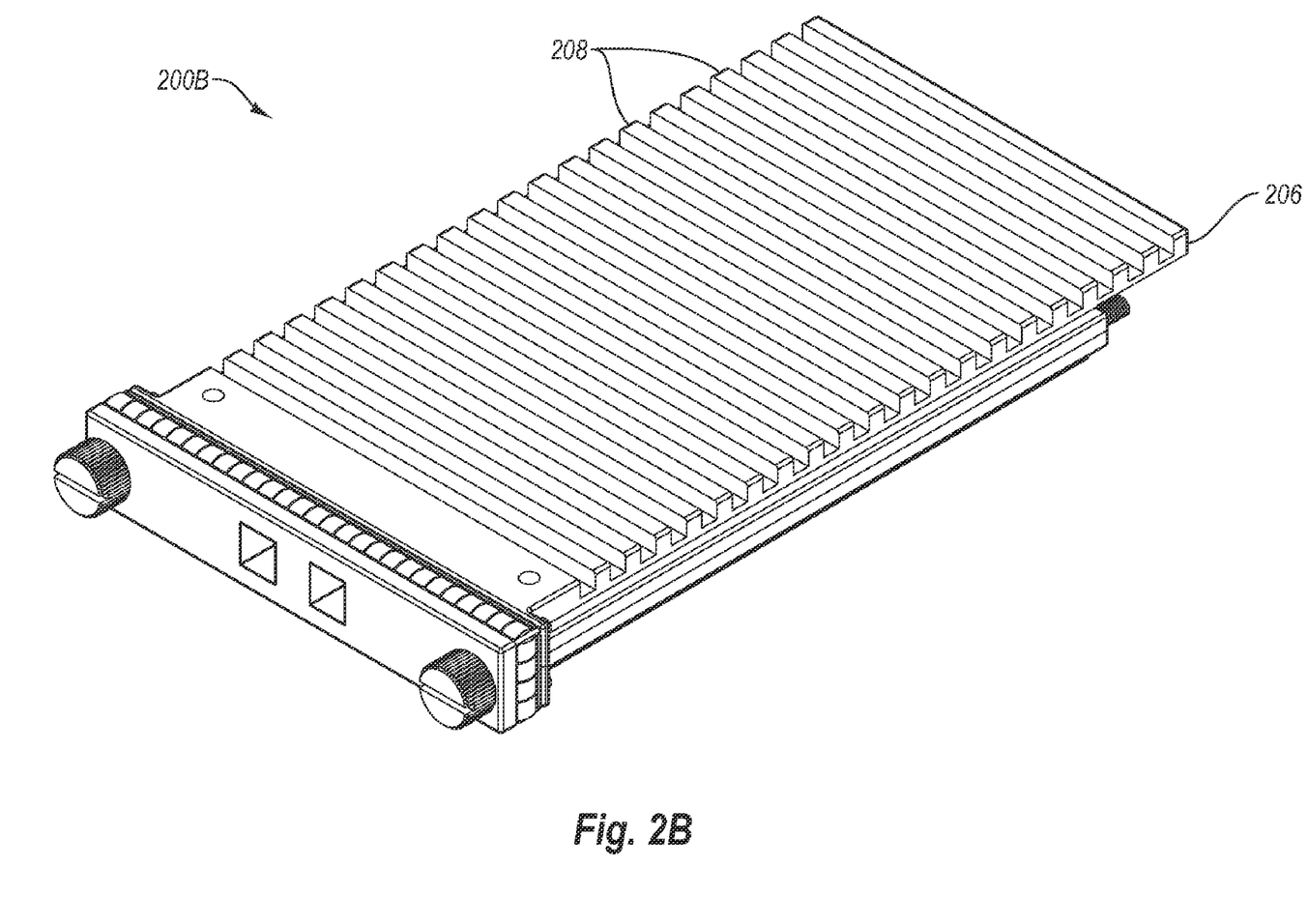

With reference now to FIGS. 2A and 2B, two example modules 200A, 200B are disclosed that may correspond to the module 102 of FIGS. 1A-1B. In more detail, FIG. 2A discloses a module 200A having an enhanced thermal interface 202 disposed on a top surface 204 of the module 200A and FIG. 2B discloses a module 200B having an integrated heatsink 206.

In some embodiments, the module 200A is a high-power module, meaning that the module 200A has relatively high power dissipation characteristics. Accordingly, the module 200A generates more heat during operation than a module having relatively low power dissipation characteristics.

To facilitate heat transfer away from the module 200A, the top surface 204 of module 200A can be a substantially planar surface. The configuration of the top surface 204 thus enables substantially 100% of the top surface 204 to be in direct physical contact with a bottom surface (not shown) of a corresponding riding heatsink in a host system, such as the riding heatsink 118 of FIGS. 1A-1B.

Further, as already mentioned, the module 200A includes an enhanced thermal interface 202 disposed on the top surface 204. The enhanced thermal interface 202 includes, for example, thermal grease, thermal gel, thermal paste, thermal tape, thermal pad(s), or the like. Accordingly, the enhanced thermal interface 202 is configured to improve or enhance the efficiency of heat transfer between the module 200A and a corresponding riding heatsink in a host system in which the module 200A is inserted. As will be explained in greater detail below, to prevent damage to the enhanced thermal interface 202, in some embodiments, the host system in which the module 200A is inserted includes means for substantially preventing sliding contact between the module 200A and the corresponding riding heatsink during insertion and/or removal of the module 200A into the host system and/or means for bringing a modular heatsink and the module 200A into contact with other in a direction substantially normal to corresponding contact surfaces of the modular heatsink and the module 200A.

In some embodiments, the module 200B of FIG. 2B is a low-power module, meaning that the module 200B has relatively low power dissipation characteristics. Accordingly, the module 200B generates less heat during operation than the module 200A in some embodiments.

As shown in FIG. 2B, the module 200B includes an integrated heatsink 206. The integrated heatsink 206 includes a plurality of heatsinking elements 208. The heatsinking elements 208 include fins in the example of FIG. 2B. However, the heatsinking elements 208 can alternately or additionally include pyramids, truncated pyramids, cones, truncated cones, cylinders with rounded tops, or the like or any combination thereof.

The integrated heatsink 206 facilitates heat transfer from the module 200B. More particularly, as the module 200B generates heat during operation, the heat can be conductively transferred to the integrated heatsink 206 and then dissipated into air flowing over the integrated heatsink 206 when the module 200B is implemented in a host system that lacks a riding heatsink. Alternately, the heat generated by the module 200B can be conductively transferred from the integrated heatsink 206 to a corresponding riding heatsink in host systems that include a riding heatsink.

III. Host Systems

Figure 3A:
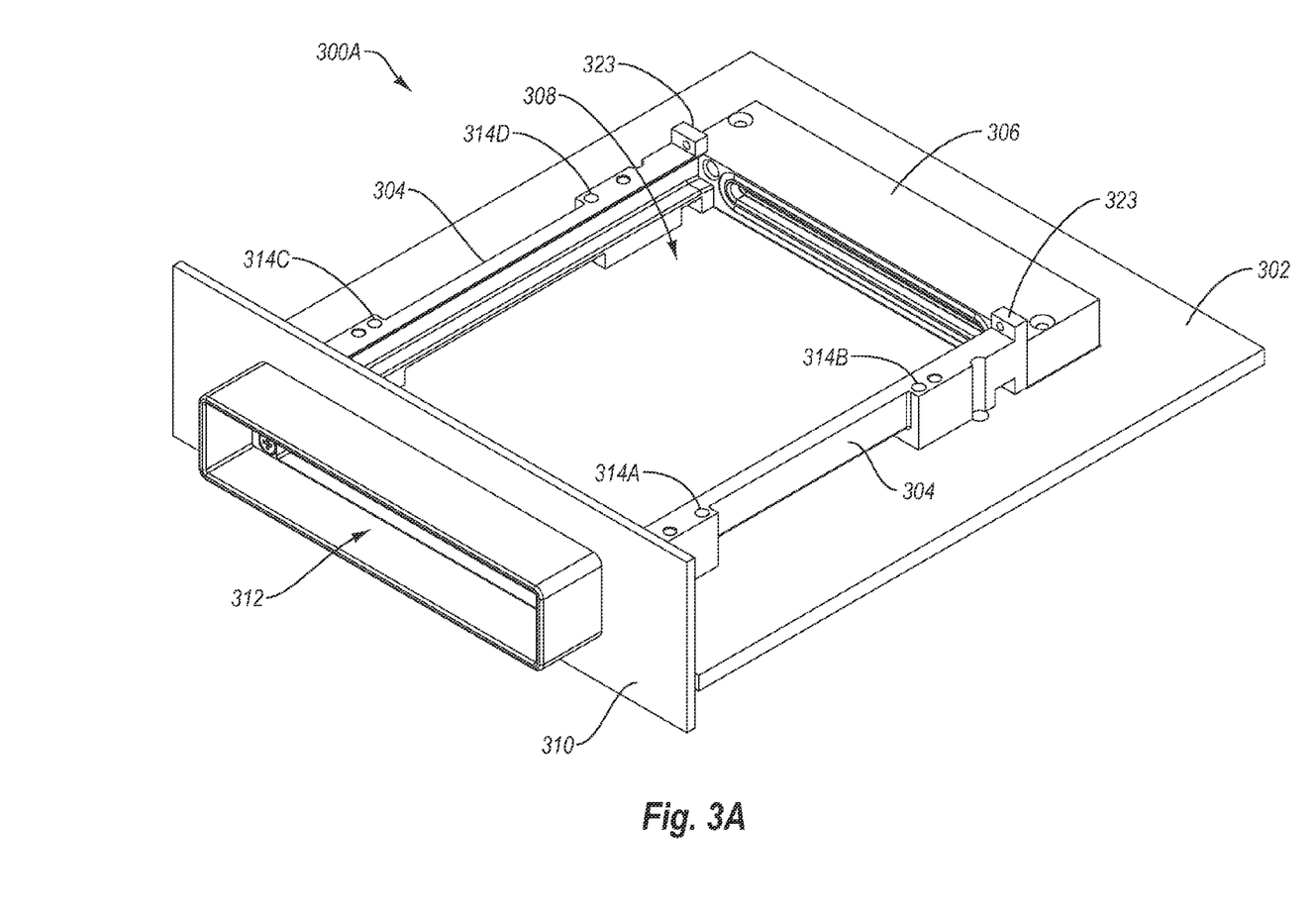
FIGS. 3A-3C depict three example host systems including standardized mounting arrangements to which modular heatsinks can be removably mounted according to embodiments of the invention.
Figure 3B:
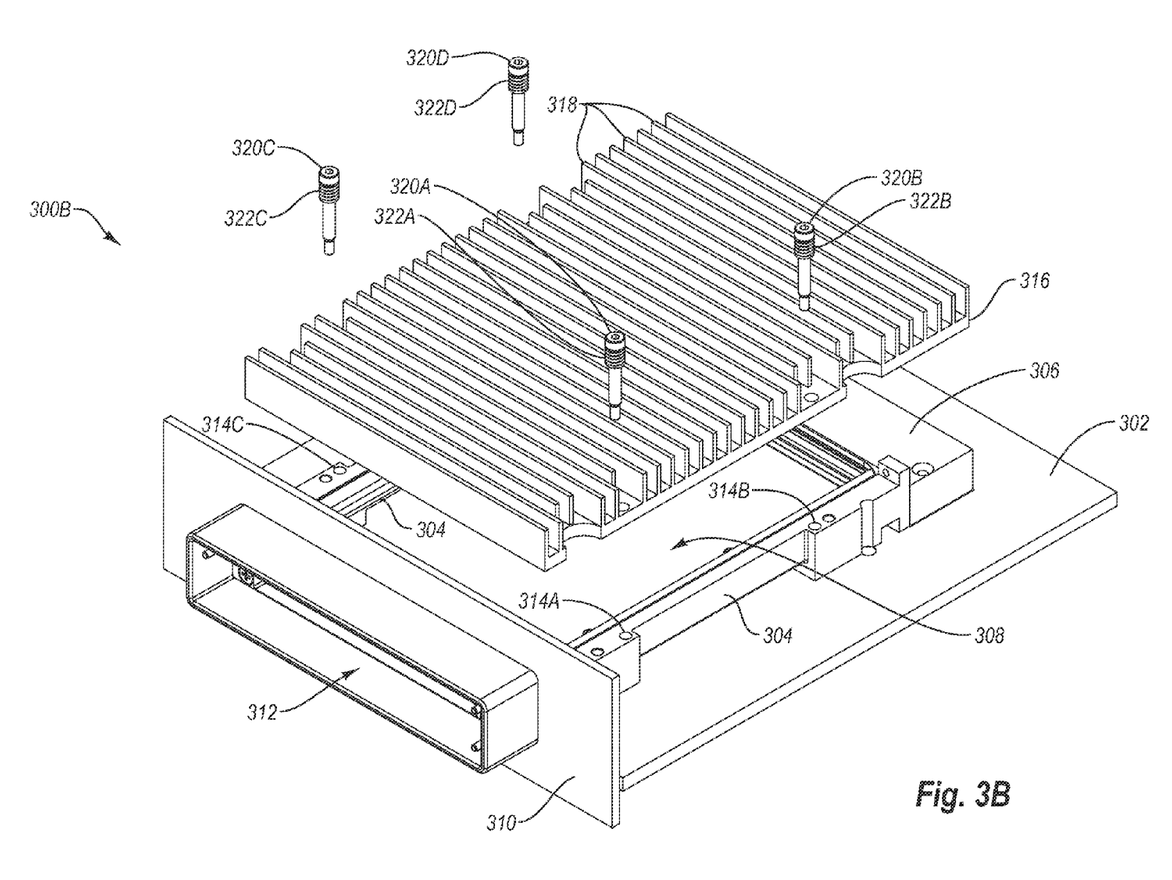
Figure 3C:
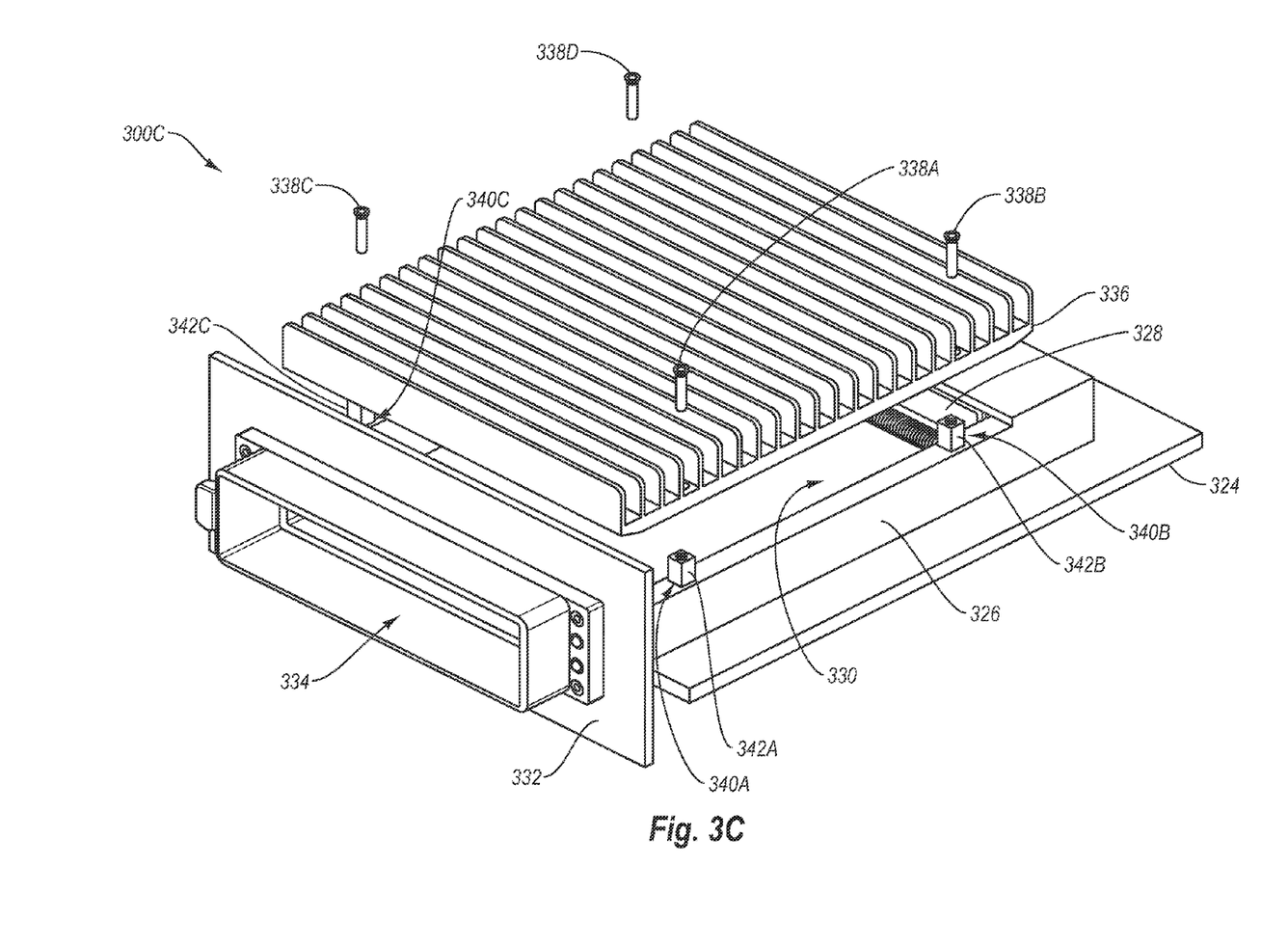

With reference now to FIGS. 3A-3C, three example host systems 300A, 300B, 300C (collectively "host systems 300") are disclosed that may correspond to the host system 104 of FIGS. 1A-1C. FIG. 3A discloses a host system 300A without a riding heatsink. FIGS. 3B and 3C disclose host systems 300B, 300C including modular riding heatsinks.

As shown in FIG. 3A, host system 300A includes a PCB 302, a plurality of rails 304 disposed on the PCB 302, and a connector 306 also disposed on the PCB 302. The PCB 302, rails 304 and connector 306 collectively define a slot 308 configured to receive a module, such as the module 102 of FIGS. 1A-1B. Optionally, the host system 300A includes a front plate 310 defining an opening 312 through which a module is inserted into and/or removed from the slot 308.

The host system 300A additionally includes a plurality of mounting points 314A, 314B, 314C, 314D (collectively "mounting points 314") disposed on the rails 304. The mounting points 314 are configured to allow a modular heatsink (not shown) to be removably mounted to the host system 300A. In some embodiments, the mounting points 314 are through holes formed in the rails 304. Although the mounting points 314 are disclosed in FIG. 3A as being disposed on the rails 304, one or more of mounting points 314 can alternately or additionally be disposed on the PCB 302, connector 306, or other component(s) of the host system 300A.

In some embodiments, the mounting points 314 are arranged in a standardized manner to allow for the interchangeable use of different modular heatsinks, if desired. The modular heatsinks may vary in one or more of width, length, height, material, or other characteristics that contribute to the heatsinking capabilities of the modular heatsinks.

As used herein, a mounting arrangement such as mounting points 314 is standardized if the mounting arrangement conforms to a defined standard. As such, any modular heatsink having a mounting arrangement that is complementary to the standardized arrangement of mounting points 314 (and that fits within space available within host system 300A) can be removably mounted to the host system 300A. The mounting points 314 serve as one example of a structural implementation of a means for removably mounting a modular heatsink to a host system. Further, although the host system 300A includes mounting points 314 for removably mounting a modular heatsink, it is not necessary that the host system 300A be operated with a modular heatsink in place.

To avoid damaging an enhanced thermal interface of a module (not shown) that is inserted into the slot 308 when a modular heatsink (not shown) is implemented with the host system 300A, the host system 300A can include a camming mechanism, clamping mechanism, or the like, that (1) brings the modular heatsink and module into contact with each other in a direction that is substantially normal to corresponding contact surfaces (e.g., top surface of the module and bottom surface of the modular heatsink) of the modular heatsink and module after the module has been substantially inserted into the host system 300A and/or that (2) substantially prevents sliding contact between the module and the modular heatsink while the module is being inserted into and/or removed from the slot 308. Optionally, the camming mechanism, clamping mechanism, or the like, can be integrated with the rails 304. As such, a camming mechanism, clamping mechanism, and/or the rails 304 all serve, either individually or in combination, as examples of a structural implementation of a means for bringing the modular heatsink and the module into contact with each other in a direction substantially normal to corresponding contact surfaces of the modular heatsink and the module. Alternately or additionally, a camming mechanism, clamping mechanism, and/or the rails 304 all serve, either individually or in combination, as examples of a structural implementation of a means for substantially preventing sliding contact between the module and the modular heatsink during insertion into and/or removal of the module from the host system 300A.

The host system 300B of FIG. 3B includes the host system 300A of FIG. 3A, further including a modular heatsink 316. As shown in FIG. 3B, the modular heatsink 316 has a plurality of fins 318 or other heatsinking elements that provide sufficient surface area for dissipating heat into air flowing over the modular heatsink 316, the heat having been conductively transferred from a module to the modular heatsink 316.

As already mentioned above, the mounting points 314 of host system 300B can be arranged in a standardized manner. As such, the modular heatsink 316 is only one example of a modular heatsink that can be removably mounted to the host system 300B. Indeed, virtually any modular heatsink having a mounting arrangement that is complementary to the standardized arrangement of mounting points 314 (and that fits within space available within host system 300B) can be removably mounted to the host system 300B. For instance, such modular heatsinks can have fins that are taller, shorter, wider, and/or narrower than the fins 318 of FIG. 3B, or such modular heatsinks can have heatsinking elements other than fins 318, such as pyramids, cones, cylinders, or the like.

In some embodiments, a plurality of shoulder screws 320A, 320B, 320C, 320D (collectively "shoulder screws 320") removably secure the modular heatsink 316 to the host system 300B. Optionally, each of shoulder screws 320 includes a compression spring 322A, 322B, 322C, 322D (collectively "compression springs 322"). When the shoulder screws 320 are inserted through corresponding holes in the modular heatsink 316 and aligned with mounting points 314 formed in rails 304, a user can exert a downward torque on the shoulder screws 320 to install shoulder screws 320 into the corresponding mounting points 314.

Similar to the host system 104 of FIGS. 1A-1B, a height of the rails 304 along a substantial length of the rails 304 in FIGS. 3A and 3B may be less than a height of a module when inserted into slot 308 to enable air to flow substantially unobstructed across the top of the module when a modular heatsink 316 is not removably attached to the mounting points 314.

The lower height of the rails 304 relative to a module inserted into slot 308 may further enable air to flow between a top surface of the module and a bottom surface of the modular heatsink 316 for improved heat transfer away from the module. For instance, when the module 200B of FIG. 2B including an integrated heatsink 206 having fins 208 is inserted into slot 308 of FIG. 3B, the tops of fins 208 may be in direct physical contact with the bottom of modular heatsink 316 to conductively transfer heat away from the module 200B, while the lower height of rails 304 relative to the module 200B allows air to flow between fins 208 such that heat can also be dissipated into the air flowing between fins 208. As such, each of rails 304 can include posts 323 at the front and back of each rail (the posts at the front of rails 304 are not visible in FIGS. 3A and 3B) that maintain the modular heatsink 316 at a height that is greater than the height along a substantial length of the rails 304.

The host system 300C of FIG. 3C is similar in some respects to the host system 300B and includes a PCB 324, plurality of rails 326 and connector 328 that collectively define a slot 330 configured to receive a module. The host system 300C further includes a front panel 332 defining an opening 334 through which a module can be inserted into and removed from the slot 330.

The host system 300C additionally includes a modular heatsink 336 that is removably secured to the host system 300C by a plurality of screws 338A, 338B, 338C, 338D (collectively "screws 338"). The modular heatsink 336 can be removably mounted to the host system 300C at a plurality of mounting points 340A, 340B and 340C using screws 338. A fourth mounting point into which screw 338D can be inserted is not visible in FIG. 3C. The mounting points 340A-340C and the fourth mounting point not visible in FIG. 3C are collectively referred to herein as mounting points 340. In some embodiments, the mounting points 340 are arranged in a standardized manner. The mounting points 340 serve as another example of a structural implementation of a means for removably mounting a modular heatsink to a host system.

As with the host systems 300A, 300B of FIGS. 3A and 3B, the host system 300C can include a camming mechanism, clamping mechanism, or the like that (1) brings the modular heatsink 336 and a module inserted into slot 330 into contact with each other in a direction that is substantially normal to corresponding contact surfaces of the modular heatsink 336 and module after the module has been substantially inserted into the slot 330 and that (2) substantially prevents sliding contact between the module and the modular heatsink while the module is being inserted into and/or removed from the slot 330. Optionally, the camming mechanism, clamping mechanism, or the like, can be integrated with the rails 326.

Similar to the host systems 300A, 300B of FIGS. 3A-3B, a height of the rails 326 may be less than a height of a module when inserted into slot 330 to enable air to flow substantially unobstructed across the top of the module when a modular heatsink 336 is not removably attached to the host system 300C. Alternately or additionally, the relatively lower height of the rails 326 relative to a module inserted into slot 330 may further enable air to flow between a top surface of the module and a bottom surface of the modular heatsink 336 for improved heat transfer away from the module. As such, mounting points 340 can include posts such as posts 342A, 342B, 342C that maintain the modular heatsink 336 at a height that is greater than the height of rails 326.

Although the host systems 300B and 300C of FIGS. 3B-3C are disclosed as employing shoulder screws 320 and screws 338 to removably secure the modular heatsinks 316, 336 to host systems 300B, 300C, respectively, host systems 300B and 300C can alternately or additionally employ other fastening means to removably secure the modular heatsinks 316, 336 to host systems 300B, 300C. Examples of other fastening means include screws, bolts, adhesives, clips, or the like or any combination thereof.

As shown in the examples of FIGS. 3A-3C, embodiments include host systems 300 that can be operated by a user with or without a modular heatsink attached to the host systems 300. Further, the host systems 300 can include standardized mounting arrangements to which modular heatsinks having complementary mounting arrangements can be removably attached. Accordingly, some embodiments allow users to operate each of host systems 300 using any one of a variety of different modular heatsinks that could potentially be obtained from in house engineering departments, manufacturers of the host systems 300, third party vendors, or other entities that manufacture and/or sell modular heatsinks having mounting arrangements that are complementary to the standardized mounting arrangement of the host systems 300.

Further, some embodiments allow users to select, if desired, a particular modular heatsink for installation at a particular slot 308, 330 according to the power dissipation characteristics of the module that will be inserted into the slot 308, 330. Thus, a user can operate particular slots 308, 330 without modular heatsinks for low-power modules, or with modular heatsinks having moderate heatsinking capabilities for mid-power modules, or with modular heatsinks having high heatsinking capabilities for high-power modules. Alternately or additionally, a user can operate particular slots 308, 330 with modular heatsinks having greater heatsinking capabilities than are necessary for a given module.

For instance, some modules configured to be inserted into host systems 300 may be configured to dissipate about 25 Watts of power, while other modules configured to be inserted into host systems 300 may be configured to dissipate about 10 Watts of power. Accordingly, some embodiments allow the use of modular heatsinks having relatively high heatsinking capabilities in slots 308, 330 configured to receive 25-Watt modules, while allowing the use of modular heatsinks having relatively low heatsinking capabilities in slots 308, 330 configured to receive 10-Watt modules.

It is appreciated that the specific numbers recited herein are provided by way of example, only, and should not be construed to limit the invention. For instance, modules inserted into slots 308, 330 may be configured to dissipate more or less than 10 Watts or 25 Watts. Alternately or additionally, the modules may be classified into more or fewer than two power classes.

Similarly, it is understood that the particular standardized mounting arrangements of FIGS. 3A-3B and 3C described and illustrated herein are given by way of example only and should not be construed to limit the invention. For instance, the standardized mounting arrangements of host systems 300A-300B and 300C may include more or fewer than four mounting points 314, 340, respectively, arranged in something other than the illustrated four-corner arrangements of FIGS. 3A-3B and 3C.

As already explained above, some embodiments of host systems 300 include means for bringing the modular heatsinks 316, 336 and modules inserted into slots 308, 330 into contact with each other in a direction substantially normal to corresponding contact surfaces of the modular heatsinks and the modules and/or means for substantially preventing sliding contact between the modules and the modular heatsinks during insertion into and/or removal of the modules from the slots 308, 330. Such means can include camming mechanisms, clamping mechanisms, rails 304, 326, or the like. Further, such means can cause each of modular heatsinks 316, 336 to be lowered onto and raised above a corresponding module when the module is inserted into and removed from each of slots 308, 330. Alternately or additionally, such means can cause a corresponding module inserted into and removed from slots 308, 330 to be raised up to and lowered below modular heatsinks 316, 336 when the module is inserted into and removed from slots 308, 330. Alternately or additionally such means can cause a combination of the foregoing possibilities.

Figure 4A:
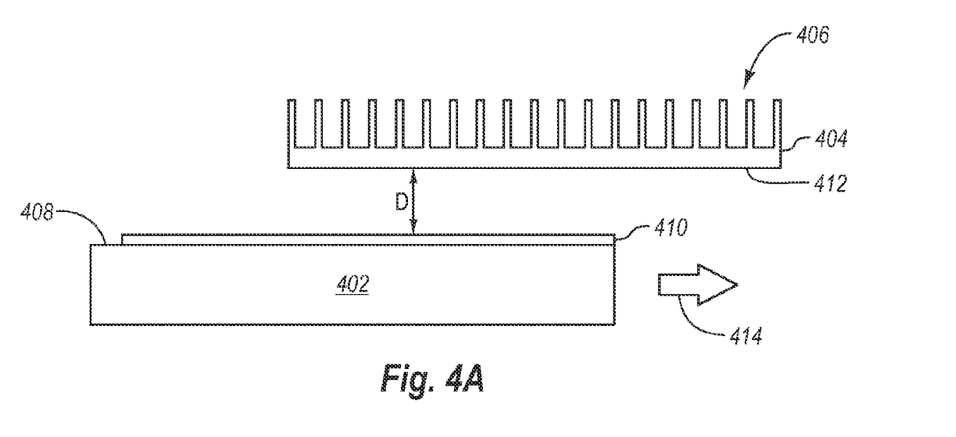
FIGS. 4A-4C depict the relative positions and motion of an optoelectronic module and modular heatsink as the optoelectronic module is inserted into a corresponding host system.
Figure 4B:
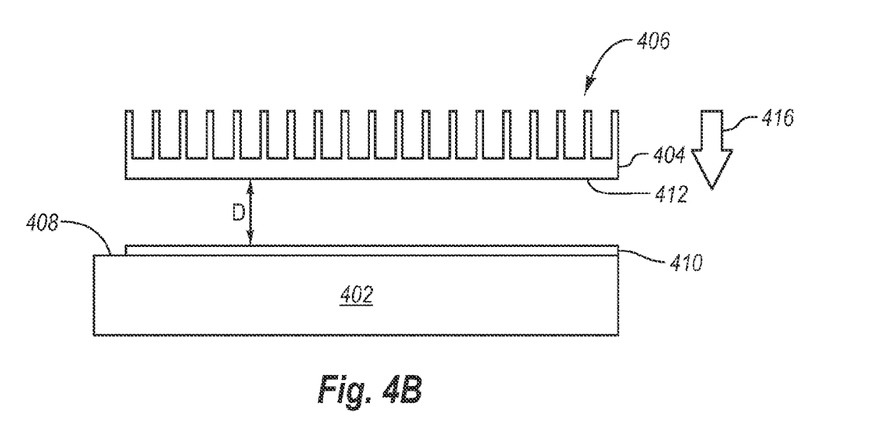
Figure 4C:
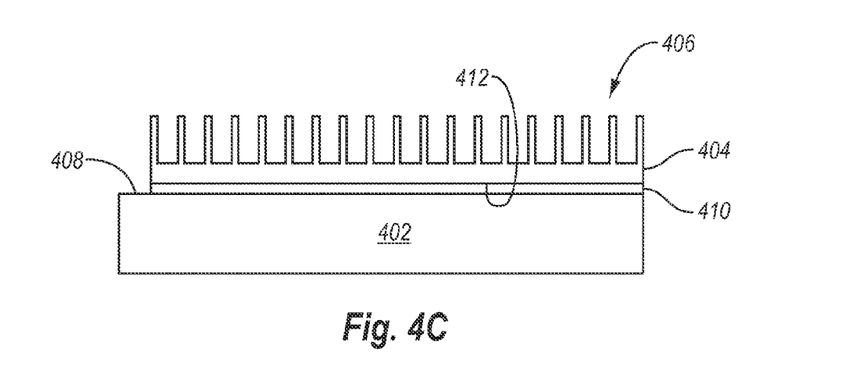

One example of the relative positions and/or motion of a module 402 and a modular heatsink 404 of a host system 406 into which the module 402 is inserted are abstractly illustrated in FIGS. 4A-4C according to some embodiments. At the outset, the module 402 and modular heatsink 404 are not drawn to scale. Further, many components of the host system 406, such as PCB, rails, connector, and/or front plate, have not been illustrated in FIGS. 4A-4C so as to more easily visualize the relative positions and/or motion of the module 402 and modular heatsink 404 during insertion of the module 402 into the host system 406.

The module 402 includes a top surface 408 and an enhanced thermal interface 410 disposed on the top surface 408. The modular heatsink 404 includes a bottom surface 412.

As shown in FIG. 4A, during insertion of the module 402, the module 402 initially moves substantially in the direction indicated by arrow 414 relative to the modular heatsink 404 and other components of host system 406. As the module 402 moves laterally in the direction 414 relative to modular heatsink 404, the enhanced thermal interface 410 is separated from the bottom surface 412 by a distance D such that the enhanced thermal interface 410 does not experience any substantial sliding contact with the bottom surface 412.

As shown in FIG. 4B, after the module 402 is substantially aligned beneath the modular heatsink 404, the modular heatsink 404 moves in a direction indicated by arrow 416 relative to module 402. The direction 416 is substantially normal to the bottom surface 412 and to the top surface 408 and enhanced thermal interface 410. The motion of modular heatsink 404 relative to module 402 continues in the direction 416 until the bottom surface 412 of modular heatsink 404 is in direct physical contact with the top surface 408 and/or the enhanced thermal interface 410 of module 402, as shown in FIG. 4C. Accordingly, the bottom surface 412 is brought into contact with the enhanced thermal interface 410 without experiencing substantial sliding contact between the bottom surface 412 and enhanced thermal interface 410, which sliding contact could otherwise potentially damage the enhanced thermal interface 410.

In some embodiments, when the module 402 reaches the position shown in FIG. 4B relative to modular heatsink 404, the module 402 engages a camming mechanism, clamping mechanism, or the like, that is included in rails of the host system 406, for instance. In this and other embodiments, the camming/clamping mechanism is engaged and/or activated by continued motion of the module 402 in the direction 414, such that the module 402 continues moving in the direction 414 and the camming/clamping mechanism causes the modular heatsink 404 to move in the direction 414 while simultaneously moving in the direction 416. Thus, even though the modular heatsink 404 moves in a direction having a lateral component in some embodiments, when the module 402 experiences motion with the same lateral component, the modular heatsink 404 can nevertheless be brought into contact with the module 402 in a direction substantially normal to contacting surfaces of the modular heatsink 404 and module 402.

FIGS. 4A-4C illustrate one example where a modular heatsink 404 is brought into contact with a module 402 in a direction substantially normal to contacting surfaces of the modular heatsink 404 and module 402 where the modular heatsink 404 and/or other components of host system 406 are lowered onto the module 402. However, the lowering of modular heatsink 404 and/or other components of host system 406 onto module 402 during insertion of the module 402 is not required in all embodiments. For instance, in other embodiments, the module 402 and/or other components of host system 406 are raised up to the modular heatsink 404 during insertion of the module 402. Alternately or additionally, in some embodiments, each of the module 402 and/or host system 406 experiences only lateral motion, only vertical motion, or a combination of lateral motion and vertical motion during any particular stage of insertion of the module 402. Further, the motion and/or the positions of module 402 and modular heatsink 404 during removal of the module 402 from host system 406 may be substantially the inverse of the motion and/or positions of module 402 and modular heatsink 404 during insertion of the module 402 into host system 406 in some embodiments.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A host system comprising:
a printed circuit board;
a plurality of rails disposed on the printed circuit board;
a connector disposed on the printed circuit board, wherein the printed circuit board, the plurality of rails, and the connector define a slot configured to receive an optoelectronic module; and
means for removably mounting a modular heatsink to the host system such that the modular heatsink directly contacts the optoelectronic module when the optoelectronic module is fully inserted into the slot, the means for removably mounting having a standardized arrangement such that any modular heatsink having a mounting arrangement that is complementary to the standardized arrangement can be removably mounted to the host system, wherein the means for removably mounting comprise a plurality of posts disposed on the plurality of rails.

2. The host system of claim 1, further comprising a modular heatsink removably mounted to the host system.

3. The host system of claim 2, further comprising means for substantially preventing sliding contact between the optoelectronic module and the modular heatsink during insertion of the optoelectronic module into the slot.

4. The host system of claim 3, wherein the means for substantially preventing sliding contact comprise one or more of: the plurality of rails, or a clamping mechanism.

5. The host system of claim 1, wherein the means for removably mounting comprise a plurality of mounting points disposed on the plurality of rails.

6. The host system of claim 1, wherein the means for removably mounting comprise a plurality of through holes formed in the plurality of rails.

7. The hose system of claim 1, wherein a height above the printed circuit board along a substantial length of each of the plurality of rails is less than a height of the module above the printed circuit board.

8. A host system comprising:
a printed circuit board;
a plurality of rails disposed on the printed circuit board;
a connector disposed on the printed circuit board, wherein the printed circuit board, the plurality of rails, and the connector define a slot configured to receive an optoelectronic module;
one or more mounting points arranged on the host system in a standardized manner allowing for interchangeable use of any one of a plurality of different modular heatsinks, each of the modular heatsinks having a mounting arrangement that is complementary to the standardized arrangement of the one or more mounting points such that each of the modular heatsinks can be removably mounted to the host system;
means for bringing a mounted modular heatsink and the optoelectronic module into contact with each other in a direction substantially normal to corresponding contact surfaces of the mounted modular heatsink and the optoelectronic module, wherein the contact surface of the optoelectronic module includes an enhanced thermal interface disposed on the contact surface of the optoelectronic module, the enhanced thermal interface comprising one or more of: thermal grease, a thermal pad, thermal gel, thermal tape, or thermal paste.

9. The host system of claim 8, wherein the means for bringing the mounted modular heatsink and the optoelectronic module into contact with each other comprises the plurality of rails.

10. The host system of claim 8, wherein the means for bringing the mounted modular heatsink and the optoelectronic module into contact with each other comprises a clamping mechanism.

11. The host system of claim 8, further comprising means for substantially preventing sliding contact between the optoelectronic module and the mounted modular heatsink during insertion of the optoelectronic module into the slot such that the enhanced thermal interface is not substantially damaged during insertion of the optoelectronic module into the slot.

12. The host system of claim 8, wherein each of the plurality of rails is characterized by a first height above the printed circuit board and the optoelectronic module is characterized by a second height above the printed circuit board that is greater than the first height.

13. The host system of claim 8, wherein each of the plurality of different modular heatsinks include characteristics that vary between the plurality of different modular heatsinks, the characteristics including one or more of width, length, height, or material.

14. A host system comprising:
a printed circuit board;
a plurality of rails disposed on the printed circuit board;
a connector disposed on the printed circuit board, wherein the printed circuit board, the plurality of rails, and the connector define a slot configured to receive an optoelectronic module; and
means for removably mounting a modular heatsink to the host system such that the modular heatsink directly contacts the optoelectronic module when the optoelectronic module is fully inserted into the slot, the means for removably mounting having a standardized arrangement such that any modular heatsink having a mounting arrangement that is complementary to the standardized arrangement can be removably mounted to the host system, wherein a height above the printed circuit board along a substantial length of each of the plurality of rails is less than a height of the module above the printed circuit board.

* * * * *